United States Patent
Ogasawara

(10) Patent No.: US 6,678,013 B2
(45) Date of Patent: Jan. 13, 2004

(54) INTERMEDIATE FREQUENCY CIRCUIT OF DIGITAL TELEVISION TUNER HAVING FLAT TRANSMISSION CHARACTERISTIC IN INTERMEDIATE FREQUENCY BAND

(75) Inventor: Yutaka Ogasawara, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 407 days.

(21) Appl. No.: 09/867,917

(22) Filed: May 29, 2001

(65) Prior Publication Data

US 2001/0048488 A1 Dec. 6, 2001

(30) Foreign Application Priority Data

May 31, 2000 (JP) ........................................ 2000-166463

(51) Int. Cl.[7] .............................. H04N 5/50; H04N 5/44
(52) U.S. Cl. ....................................... 348/731; 348/725
(58) Field of Search .................................. 348/725, 726, 348/731, 732, 733; 375/316, 324; 455/339, 179.1, 182.3; 334/14, 86; 329/315, 300; H04N 5/44, 5/50

(56) References Cited

U.S. PATENT DOCUMENTS

| | | | |
|---|---|---|---|
| 4,237,487 A | * 12/1980 | Ikeda et al. .................. | 348/725 |
| 5,737,035 A | * 4/1998 | Rotzoll ....................... | 348/725 |
| 5,862,174 A | * 1/1999 | Yokota et al. ............... | 375/324 |

FOREIGN PATENT DOCUMENTS

| | | |
|---|---|---|
| JP | 5-206738 | 8/1993 |
| JP | 11-239072 | 8/1999 |

* cited by examiner

*Primary Examiner*—Sherrie Hsia
(74) *Attorney, Agent, or Firm*—Brinks Hofer Gilson & Lione

(57) ABSTRACT

Disclosed is an intermediate frequency circuit of a digital television tuner having a flat transmission characteristic in an intermediate frequency band and in which a transistor is prevented from being destroyed by a shock wave such as static electricity applied on the output side. This intermediate frequency circuit has: a transistor for amplifying a television signal in an intermediate frequency band; a low-pass filter provided between a collector of the transistor and an output terminal; and a parallel tuning circuit provided between the collector of the transistor and the ground. Each of a cut-off frequency of the low-pass filter and a tuning frequency of the parallel tuning circuit is set to be equal to or higher than the intermediate frequency band.

3 Claims, 1 Drawing Sheet

INTERMEDIATE FREQUENCY CIRCUIT OF DIGITAL TELEVISION TUNER HAVING FLAT TRANSMISSION CHARACTERISTIC IN INTERMEDIATE FREQUENCY BAND

BACKGROUND OF THE INVENTION

1. Field of the Invention

The present invention relates to an intermediate frequency circuit of a digital television tuner and, more particularly, to an intermediate frequency circuit of a digital television tuner capable of outputting an intermediate frequency signal of a digital television with a characteristic which is flat in an intermediate frequency band.

2. Related Art

FIG. 3 shows a conventional intermediate frequency circuit of a digital television tuner (hereinbelow, called intermediate frequency circuit). An intermediate frequency signal of a digital television outputted from a not-illustrated mixer (simply called an intermediate frequency signal) passes through an SAW filter 21 for band regulation and is supplied to (the base of) a transistor 22 for amplifying intermediate frequencies. A power source voltage is supplied to the collector of the transistor 22 via a choke inductor 23. An intermediate frequency signal outputted from the collector is supplied to a low-pass filter 25 via a DC blocking capacitor 24. The low-pass filter 25 is connected to an output terminal 26.

The low-pass filter 25 takes the form of a π type low-pass filter having an input-side shunted capacitor 25a, a serial inductance device 25b, and an output-side shunted capacitor 25c. Its cut-off frequency is higher than the frequencies in the intermediate frequency band.

A nominal impedance is set so as to be a few hundreds Ω (ohm) in relation to a circuit to be connected at the next stage. On the input side of the low-pass filter 25, a resistor 27 is connected in parallel to the choke inductor 23. On the output side as well, a resistor 28 is connected in parallel to the output-side shunted capacitor 25c. By both of the resistors, a predetermined nominal impedance is determined.

In the above configuration, the transmission characteristic in the output terminal 26 is determined mainly by the transmission characteristic of the SAW filter 21 and the amplification characteristic of the transistor 22.

For example, when the SAW filter 21 has a passband of 8 MHz and a center frequency of 36 MHz, the transmission characteristic in the output terminal 26 is as shown in FIG. 4 that the level in the intermediate frequency band (8 MHz) is inclined. The level is high at low frequencies and becomes low at high frequencies for the following reason. The higher the frequency becomes, the more the gain of the transistor 22 decreases and, further, the cut-off frequency of the low-pass filter 25 is higher than the intermediate frequency band.

As a result, a level difference occurs in digital television signals in the band, so that it is difficult to reproduce a video image with high fidelity.

There is a case such that static electricity of a high voltage generated in an assembling process of the intermediate frequency circuit of the invention is applied to the output terminal 26. Such static electricity passes through the low-pass filter 25 and is transmitted to the collector of the transistor 22. The static electricity vibrates in the passing process, so that it has a predetermined frequency component. Since the impedance of the DC blocking capacitor 24 in the frequency component is low and that of the choke inductor 23 connected to the collector of the transistor 22 is high, the static electricity is applied to the collector of the transistor 22 and a problem such that the transistor is destroyed occurs.

SUMMARY OF THE INVENTION

An object of the invention is, therefore, to provide an intermediate frequency circuit having a flat transmission characteristic in an intermediate frequency band, and in which a transistor is prevented from being destroyed by a shock wave of static electricity or the like applied to the output side.

As means for achieving the object, an intermediate frequency circuit of a digital television tuner of the invention has: a transistor for amplifying a television signal in an intermediate frequency band; a low-pass filter provided between a collector of the transistor and an output terminal; and a parallel tuning circuit provided between the collector of the transistor and the ground. Each of a cut-off frequency of the low-pass filter and a tuning frequency of the parallel tuning circuit is set to be equal to or higher than the intermediate frequency band.

The parallel tuning circuit and the low-pass filter are coupled to each other via a first capacitor, the parallel tuning circuit has at least an inductance device for supplying a power source voltage to the collector of the transistor, a terminal on the power source side of the inductance device is connected to the ground via a second capacitor, and a reactance of the first capacitor at a frequency equal to or lower than the intermediate frequency band is set to be larger than a reactance of the second capacitor.

The reactance of the first capacitor at a frequency in the intermediate frequency band is set to be smaller than a nominal impedance of the low-pass filter.

DETAILED DESCRIPTION OF THE PREFERRED EMBODIMENTS

Figure 1:
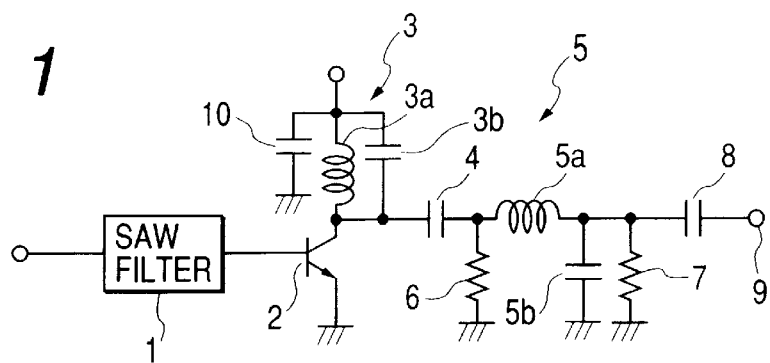
FIG. 1 is a configuration diagram of an intermediate frequency circuit of a digital television tuner of the invention.

FIG. 1 shows an intermediate frequency circuit of a digital television tuner of the invention. An intermediate frequency signal of a digital television (simply called an intermediate frequency signal) outputted from a mixer (not shown) passes through an SAW filter 1 for band regulation and is supplied to (the base of) a transistor 2 for amplifying intermediate frequencies. A power source voltage is supplied to the collector of the transistor 2 via a choke inductor 3a as an inductance device. A capacitor 3b is connected in parallel to the choke inductor 3a, and a parallel tuning circuit 3 is constructed by the choke inductor 3a and the capacitor 3b.

The tuning frequency of the parallel tuning circuit 3 is set so as to be higher than a frequency band (intermediate frequency band) of the intermediate frequency signal. For example, when the center frequency of the intermediate frequency band is 36 MHz and the band width is 8 MHz, the tuning frequency is set to about 50 to 70 MHz.

A low-pass filter 5 is connected to the parallel tuning circuit 3 via a first capacitor 4. The low-pass filter 5 takes the form of an L-type low-pass filter constructed by a serial inductance device 5a and an output-side shunted capacitor 5b. The cut-off frequency is higher than the intermediate frequency band and is set to about 60 to 80 MHz.

A nominal impedance of the low-pass filter 5 is set so as to be about 300 Ω (ohm) in relation with a circuit to be connected at the next stage. Consequently, the input side of the low-pass filter 5 is shunted by a resistor 6 of 600 Ω and the output side is also shunted by a resistor 7 of 600 Ω. The output side of the low-pass filter 5 is connected to an output terminal 9 via a DC blocking capacitor 8.

One end on the power source side of the choke inductor 3a for supplying a power source voltage to the collector of the transistor 2 is connected to the ground via a second capacitor 10. Each of the reactance of the second capacitor 10 and that of the choke inductor 3a at a frequency lower than the intermediate frequency band is set to be smaller than the reactance of the first capacitor 4. Further, the reactance of the first capacitor 4 is smaller than the nominal impedance of the low-pass filter 5 in the intermediate frequency band.

In the above configuration, the transmission characteristic in the intermediate frequency band at the output terminal 9 is determined mainly by the transmission characteristic of the SAW filter 1, amplification characteristic of the transistor 2, and transmission characteristics of the parallel tuning circuit 3 and the low-pass filter 5. The SAW filter 1 has flat characteristics in which a center frequency is about 36 MHz and a passband is 8 MHz. As the frequency becomes higher, the gain of the transistor 2 decreases, so that a declining characteristic is obtained. Since the low-pass filter 5 has a cut-off frequency higher than the intermediate frequency band, a declining characteristic is similarly obtained. The characteristic obtained from both of the characteristics is as shown by a curve A in FIG. 2. On the other hand, since the parallel tuning circuit 3 itself has a tuning frequency higher than the intermediate frequency band, a climbing characteristic as shown by a curve B in FIG. 2 is obtained.

Figure 2:
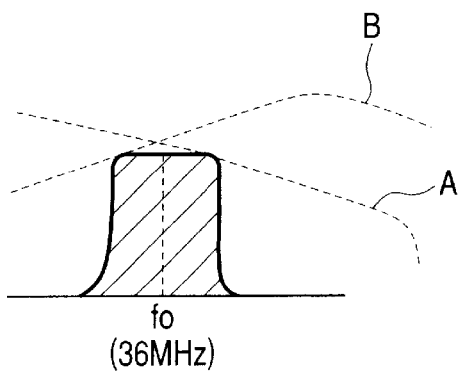
FIG. 2 is a transmission characteristic diagram of the intermediate frequency circuit of the digital television tuner of the invention.
Figure 3:
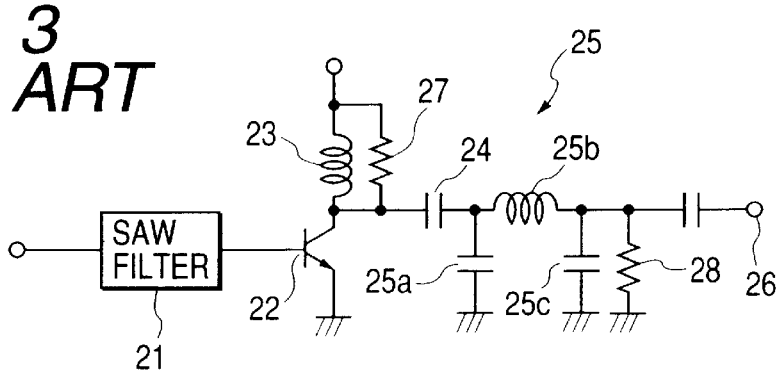
FIG. 3 is a configuration diagram of an intermediate frequency circuit of a conventional digital television tuner.
Figure 4:
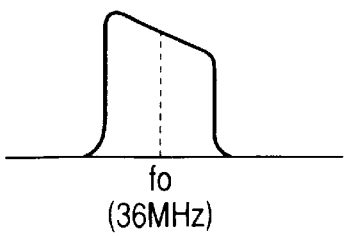
FIG. 4 is a transmission characteristic diagram of the intermediate frequency circuit of the conventional digital television tuner.

As a result, the transmission characteristic as a whole becomes flat in the intermediate frequency band as shown by a hatched portion in FIG. 2.

Therefore, the intermediate frequency signal of a digital television becomes flat in the intermediate frequency band. Since the tuning frequency of the parallel tuning circuit 5 lies out of the intermediate frequency band, a signal is outputted without deteriorating a group delay, and a video image is reproduced with high fidelity.

At frequencies lower than the intermediate frequency band, the reactance of the second capacitor 10 is smaller than that of the first capacitor 4. Consequently, an external voltage having a frequency component lower than the intermediate frequency band, such as static electricity, a shock wave, and the like entering from the output terminal 9 is attenuated by the first capacitor 4 and is connected to the ground via the choke inductor 3a and the second capacitor 10 so as to bypass the transistor 2. The transistor 2 is, therefore, not easily destroyed.

Since the reactance of the first capacitor 4 is smaller than the nominal impedance of the low-pass filter 5 in the intermediate frequency band, the capacitor 3b as a component of the parallel tuning circuit 5 can also serve as an input-side shunted capacitor of the low-pass filter 5.

As described above, the intermediate frequency circuit of a digital television tuner of the invention has: the transistor for amplifying a television signal in an intermediate frequency band; the low-pass filter provided between a collector of the transistor and an output terminal; and the parallel tuning circuit provided between the collector of the transistor and the ground. Each of a cut-off frequency of the low-pass filter and a tuning frequency of the parallel tuning circuit is set to be equal to or higher than the intermediate frequency band. Thus, a flat characteristic is obtained in the intermediate frequency band.

Therefore, the intermediate frequency signal of the digital television is outputted with the flat characteristic in the intermediate frequency band. Without deteriorating a group delay, a video image can be reproduced with high fidelity.

The parallel tuning circuit and the low-pass filter are coupled to each other via a first capacitor, the parallel tuning circuit has at least an inductance device for supplying a power source voltage to the collector of the transistor, a terminal on the power source side of the inductance device is connected to the ground via a second capacitor, and a reactance of the first capacitor at a frequency equal to or lower than the intermediate frequency band is set to be larger than a reactance of the second capacitor. Consequently, an external voltage having a frequency component lower than the intermediate frequency band, such as static electricity, a shock wave, and the like entering from the output terminal is attenuated by the first capacitor and is connected to the ground via the choke inductor and the second capacitor so as to bypass the transistor. The transistor is, therefore, not easily destroyed.

The reactance of the first capacitor at a frequency in the intermediate frequency band is set to be smaller than a nominal impedance of the low-pass filter. Consequently, the capacitor as a component of the parallel tuning circuit can also serve as an input-side shunted capacitor of the low-pass filter, so that the number of parts in the specification can be reduced.

What is claimed is:

1. An intermediate frequency circuit of a digital television tuner, comprising:

a transistor to amplify a television signal in an intermediate frequency band;

a low-pass filter provided between a collector of the transistor and an output terminal; and a parallel tuning circuit provided between the collector of the transistor and a ground, wherein each of a cut-off frequency of the low-pass filter and a tuning frequency of the parallel tuning circuit is not less than the intermediate frequency band.

2. An intermediate frequency circuit of a digital television tuner according to claim 1, wherein the parallel tuning circuit and the low-pass filter are coupled to each other via a first capacitor, the parallel tuning circuit has at least an inductance device to supply a power source voltage to the collector of the transistor, a terminal on a power source side of the inductance device is connected to the ground via a second capacitor, and a reactance of the first capacitor at a frequency not greater than the intermediate frequency band is larger than a reactance of the second capacitor.

3. An intermediate frequency circuit of a digital television tuner according to claim 2, wherein the reactance of the first capacitor at a frequency in the intermediate frequency band is smaller than a nominal impedance of the low-pass filter.

* * * * *